(12) United States Patent
Monma et al.

(10) Patent No.: US 7,276,950 B2
(45) Date of Patent: Oct. 2, 2007

(54) PREVENTION OF THE PROPAGATION OF JITTERS IN A CLOCK DELAY CIRCUIT

(75) Inventors: Atsuko Monma, Tokyo (JP); Kanji Oishi, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 57 days.

(21) Appl. No.: 11/254,050

(22) Filed: Oct. 20, 2005

(65) Prior Publication Data

US 2006/0091926 A1    May 4, 2006

(30) Foreign Application Priority Data

Oct. 29, 2004    (JP) .............................. 2004-316035

(51) Int. Cl.
*H03L 7/06* (2006.01)
*H03H 11/26* (2006.01)

(52) U.S. Cl. ...................... 327/262; 327/158; 327/270

(58) Field of Classification Search ........ 327/156–158, 327/147–149, 261–263, 270, 276
See application file for complete search history.

(56) References Cited

U.S. PATENT DOCUMENTS

| | | | | |
|---|---|---|---|---|
| 5,191,234 | A * | 3/1993 | Murakami et al. .......... | 327/172 |
| 5,272,729 | A | 12/1993 | Bechade et al. | |
| 5,777,501 | A * | 7/1998 | AbouSeido ................. | 327/274 |
| 6,008,680 | A | 12/1999 | Kyles et al. | |
| 6,177,846 | B1 | 1/2001 | Takada et al. | |
| 6,184,753 | B1 | 2/2001 | Ishimi et al. | |
| 6,316,987 | B1 * | 11/2001 | Dally et al. ................. | 327/538 |
| 6,369,627 | B1 | 4/2002 | Tomita | |
| 6,573,763 | B2 | 6/2003 | Iijima | |
| 6,750,688 | B2 | 6/2004 | Takai | |
| 6,937,081 | B2 | 8/2005 | Ishikawa | |

FOREIGN PATENT DOCUMENTS

| | | | |
|---|---|---|---|
| JP | | 05-218820 B2 | 8/1993 |
| JP | | 11-168376 A | 6/1999 |
| JP | | 11-177399 A | 7/1999 |
| JP | | 11-312959 A | 11/1999 |
| JP | | 2000-315942 A | 11/2000 |
| JP | | 2001-056723 A | 2/2001 |
| JP | | 2001-111394 A | 4/2001 |
| JP | | 2002-344293 A | 11/2002 |
| JP | | 2003-101409 A | 4/2003 |
| JP | | 2004-171082 A | 6/2004 |
| JP | | 2004-194118 A | 7/2004 |

* cited by examiner

*Primary Examiner*—Dinh T. Le
(74) *Attorney, Agent, or Firm*—Foley & Lardner LLP

(57) ABSTRACT

The clock delay circuit according to the present invention includes a delay circuit section, a selection circuit section, and jitter suppression elements. The delay circuit section provides a plurality of delay clock signals that are obtained by delaying a clock signal with a different delay amount. The selection circuit section selects and provides any one of a plurality of delay clock signals that are provided from the delay circuit section. The jitter suppression elements are connected in series between the delay circuit section and the selection circuit section. When jitters occur at the time of switching the delay clock signals at the selection circuit section, the jitter suppression elements serve to prevent the propagation of the jitters through the delay circuit section.

5 Claims, 5 Drawing Sheets

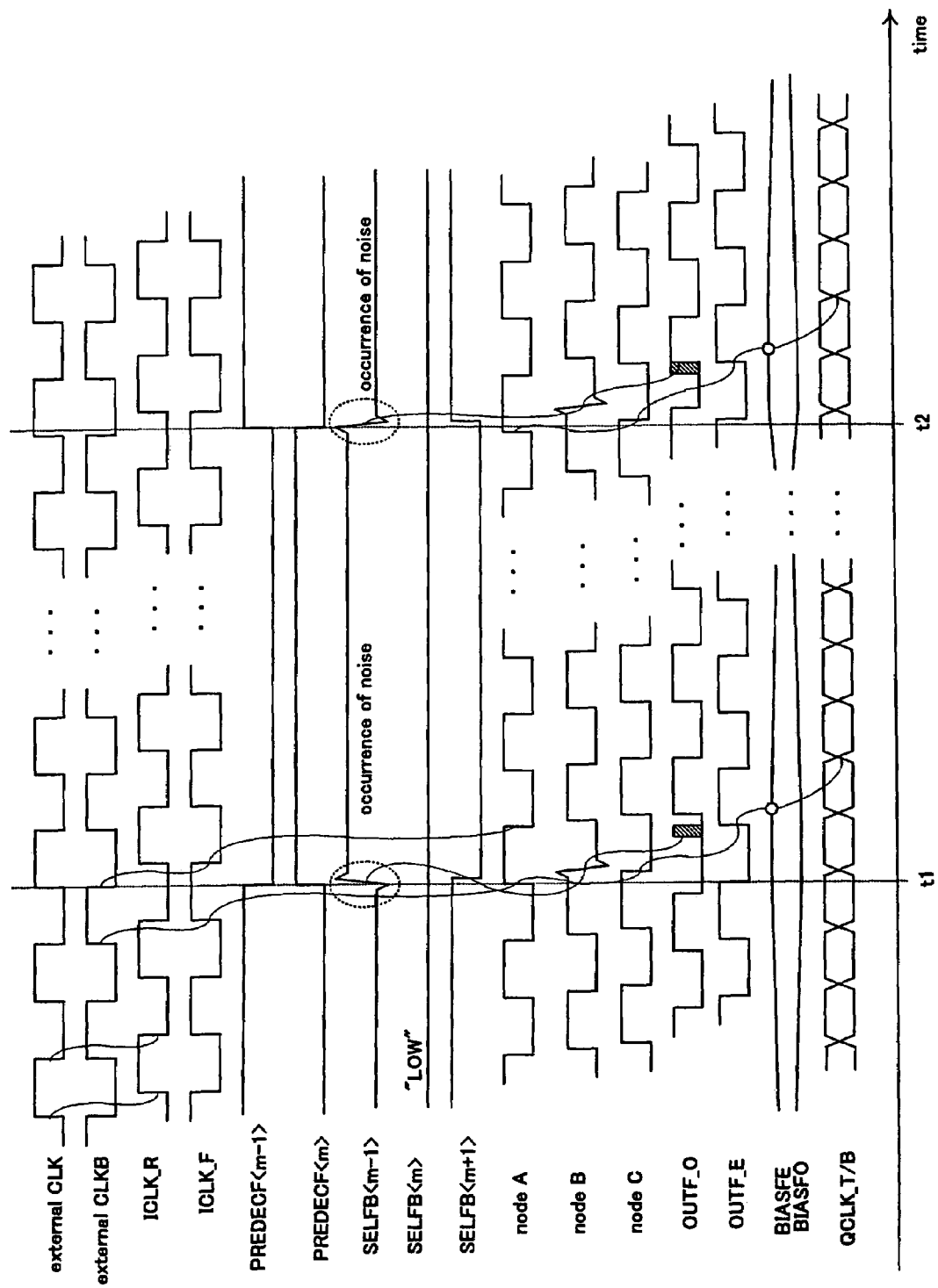

PREVENTION OF THE PROPAGATION OF JITTERS IN A CLOCK DELAY CIRCUIT

BACKGROUND OF THE INVENTION

1. Field of the Invention

The present invention relates to a clock delay circuit, and more particularly to a clock delay circuit in a DLL (Delay-Locked Loop) circuit to be mounted in a semiconductor memory device.

2. Description of the Related Art

To enable high-speed operation, some semiconductor memory devices output a data synchronous with both the rising and falling edges of clock. Semiconductor memory devices of this type are disclosed in JP-A-2001-056723, JP-A-2001-111394, JP-A-2003-101409, and JP-A-2004-171082.

A DLL circuit is mounted in the above-described semiconductor memory devices. The DLL circuit both generates data output clock QCLK_T for providing data signal DQ in synchronization with the rising edge of the clock and generates data output clock QCLK_B for providing data signal DQ in synchronization with the falling edge of the clock. The DLL circuit then provides a data signal DQ in synchronization with the rising edge of the clock based on data output clock QCLK_T and provides a data signal DQ in synchronization with the falling edge of the clock based on data output clock QCLK_B.

In the semiconductor memory device, the higher the frequency of the clock, the greater the effect that data signal DQ brought about by the jitter of data output clocks QCLK_T and QCLK_B generated in the DLL circuit. It is therefore a crucial issue in the design of a semiconductor memory device, to reduce of the jitter of data output clocks QCLK_T and QCLK_B.

FIG. 1 shows an example of the configuration of a typical DLL circuit, and FIG. 2 shows an example of the configuration of a clock delay circuit of the prior art in a DLL circuit.

As shown in FIG. 1, a typical DLL circuit includes: input buffer (IN) 101; clock delay circuits (Delay Lines) 102R and 102F; interpolator circuits (Interpolators) 103R and 103F; level shift circuit (Level Shifter) 104; output buffer (OUT) 105; replica circuits (Replicas) 106R and 106F; P/D (Phase/Detector) circuits 107R and 107F; Rise control circuit (Rise control) 108R; Fall control circuit (Fall control) 108F; Rise counter 109R; Fall counter 109F; predecoder circuit (Pre Dec) 110R and 110F; and 5-bit DAC (Digital Analog Converter) circuits 111R and 111F.

Input buffer 101 receives mutually complementary external clock signal CLK and external clock signal CLKB and provides internal clock signal ICLK_R for the Rise CLK and internal clock signal ICLK_F for the Fall CLK.

Clock delay circuit 102R provides delay clock signals OUTR_O and OUTR_E that are the delayed internal clock signal ICLK_R, and clock delay circuit 102F provides delay clock signals OUTF_O and OUTF_E that are the delayed internal clock signal ICLK_F.

Interpolator circuit 103R mixes delay clock signals OUTR_O and OUTR_E at a mix ratio that corresponds to bias voltage BIASRE/O. In addition, interpolator circuit 103F mixes delay clock OUTF_O and OUTF_E at a mix ratio that corresponds to bias voltage BIASFE/O.

Level shift circuit 104 generates data output clocks QCLK_T and QCLK_B based on the output from interpolator circuits 103R and 103F and converts the level of data output clocks QCLK_T and QCLK_B that have been generated. More specifically, level shift circuit 104 determines the rising edge of data output clock QCLK_T based on the rising edge of a signal obtained by mixing delay clock signals OUTR_O and OUTR_E. Level shift circuit 104 determines the rising edge of data output clock QCLK_B based on the rising edge of a signal obtained by mixing delay clock signals OUTF_O and OUTF_E. In addition, since clock delay circuits 102R and 102F, interpolator circuits 103R and 103F, and 5-bit DAC circuits 111R and 111F are influenced by voltage fluctuation and noise when they employ an external voltage, they employ an internal voltage (constant voltage). Other constituent elements employ an external voltage. Level shift circuit 104 therefore carries out the above-described level conversion operation.

Output buffer 105 both provides data signal DQ in synchronization with the rising edge of the clock based on data output clock QCLK_T and provides data signal DQ in synchronization with the falling edge of the clock based on data output clock QCLK_B.

Replica circuit 106R generates a replica signal RCLK of data output clock QCLK_T. Replica circuit 106F generates a replica signal FCLK of data output clock QCLK_B.

P/D circuit 107R compares the phase of the rising edges of external clock signal CLK and the phase of replica signal RCLK to determine whether the phase of replica signal RCLK is behind or in advance of external clock signal CLK. P/D circuit 107F compares the phase of the rising edges of external clock signal CLKB and replica signal FCLK to determine whether the phase of replica signal FCLK is behind or in advance of external clock signal CLKB.

Rise control circuit 108R controls the count values of Rise counter 109R based on the determination result of P/D circuit 107R. More specifically, Rise control circuit 108R increments the count value when the phase of replica signal RCLK leads relative to external clock signal CLK to delay the phase of replica signal RCLK. On the other hand, when the phase of replica signal RCLK lags relative to external clock signal CLK, Rise control circuit 108R decrements the count value to advance the phase of replica signal RCLK. Fall control circuit 108F controls the count values of Fall counter 109F based on the determination result of P/D circuit 107F. The control procedure of Fall control circuit 108F is the same as that of Rise control circuit 108R.

Rise counter 109R is an UP/DOWN counter whose count value is controlled by Rise control circuit 108R. The upper order five bits of the count value of Rise counter 109R are provided to predecoder circuit 110R as the values to determine the amount of delay in clock delay circuit 102R, and the lower order five bits are provided to 5-bit DAC circuit 111R as values to determine the mix ratio of delay clock signals OUTR_O and OUTR_E in interpolator circuit 103R. In addition, Fall counter 109F is an UP/DOWN counter whose count value is controlled by Fall control circuit 108F. The upper order five bits of the count value of Fall counter 109F are provided to predecoder circuit 110F as values to determine the amount of delay in clock delay circuit 102F, and the lower order five bit are provided to 5-bit DAC circuit 111F as values to determine the mix ratio of delay clock signals OUTF_O and OUTF_E in interpolator circuit 103F.

Predecoder circuit 110R carries out a process for predecoding the upper order five bits of the count value of Rise counter 109R, and provides predecoding signal PREDECR to determine the amount of delay in clock delay circuit 102R. Predecoder circuit 110F carries out a process for predecoding the upper order five bits of the count value of Fall counter 109F and provides predecoding signal PREDECF to determine the amount of delay in clock delay circuit 102F.

5-bit DAC circuit 111R converts the lower order five bits of the count value of Rise counter 109R from a digital signal to an analog signal, and to generate and provide bias voltage BIASRE/O to determine the mix ratio of delay clock signals OUTR_O and OUTR_E. 5-bit DAC circuit 111F receives the lower order five bits of the count value of Fall counter 109F and generates and provides bias voltage BIASFE/O to determine the mix ratio of delay clock signals OUTF_O and OUTF_E.

In the DLL circuit that is configured as described above, rough adjustment of the amount of delay of internal clocks ICLK_R and ICLK_F that are produced from external clocks CLK and CLKB is performed by the counter control implemented by clock delay circuits 102R and 102F. Thereby, delay clocks OUTR_O, OUTR_E, OUTF_O, and OUTF_E having a fixed delay amounts are provided from clock delay circuits 102R and 102F. Delay clocks OUTR_O and OUTR_E, and OUTF_O and OUTF_E are mixed by interpolator circuits 103R and 103F for fine adjustment of the delay amounts. Level shift circuit 104 generates and provides data output clocks QCLK_T and QCLK_B to provide data signal DQ in accordance with external clocks CLK and CLKB based on the output from interpolator circuits 103R and 103F.

As shown in FIG. 2, a clock delay circuit of the prior art includes: delay circuit section 41R, selection circuit section 42R, delay circuit section 41F, and selection circuit section 42F.

Delay circuit section 41R and selection circuit section 42R constitute Rise CLK clock delay circuit 102R shown in FIG. 1. Delay circuit section 41R provides a plurality of delay clocks produced by delaying internal clock signal ICLK_R with each delay clock having a different delay amount. Selection circuit section 42R arbitrarily selects any one of a plurality of delay clocks that have been provided from delay circuit section 41R, and provides the selected delay clocks as delay clocks OUTR_O and OUTR_E.

Delay circuit section 41F and selection circuit section 42F constitute Fall CLK clock delay circuit 102F shown in FIG. 1. Delay circuit section 41F provides a plurality of delay clocks produced by delaying internal clock ICLK_F with each delay clock having a different delay amount. Selection circuit section 42F arbitrarily selects any one of a plurality of delay clocks that have been provided from delay circuit section 41F and provides the selected delay clocks as delay clock signals OUTF_O and OUTF_E.

Since the Rise CLK circuit and the Fall CLK circuit are of the same configuration, only the Fall CLK circuit configuration will be explained below.

Delay circuit section 41F is of a configuration in which a plurality of delay circuits 411 for delaying internal clock ICLK_F by fixed delay amounts are connected in cascades. The amounts of delay of the delay clocks that are provided from each of the plurality of delay circuits 411 thus differ from each other.

Each of delay circuits 411 includes inverter NV 412, capacitor (constituted by an NMOS transistor in FIG. 2) 413, and capacitor (constituted by a PMOS transistor in FIG. 2) 414. In this way, delay circuit 411 adjusts the fixed delay amount by providing a capacitance load by means of capacitors 413 and 414 in the output part of inverter NV 412.

Selection circuit section 42F is of a configuration in which a plurality of selection circuits 421 are connected in cascades, these selection circuits 421 being associated with the plurality of delay circuits 411, for selecting delay clocks that are provided from the delay circuits 411 with which they are associated, and for providing the selected delay clocks as delay clocks OUTF_O and OUTF_E. In selection circuit section 42F, moreover, a delay clock that has been selected by any of selection circuits 421 that are of odd-numbered stages is provided as delay clock OUTF_O, and a delay clock that has been selected by any of selection circuits 421 that are of even-numbered stages is provided as delay clock OUTF_E.

Each of selection circuit 421 includes: NAND element NA 422, inverter NV 423, and clocked inverters CN 424 and 425.

For example, the following operations are carried out in second-stage selection circuit 421, which is an even-numbered stage, among selection circuits 421 that makes up selection circuit section 42F of FIG. 2. NAND element NA 422 calculates the NAND of both predecoding signal PREDECF<2> from predecoder circuit 110F to selection circuit 421 of its own stage (second stage) and predecoding signal PREDECF<1> from predecoder circuit 110F to selection circuit 421 of the preceding stage (first stage). Inverter NV 423 inverts and provides the output of NAND element NA 422. Clocked inverter CN 424 inverts and provides the delay clock from selection circuit 421 of the next even-numbered stage (fourth stage) in accordance with the inverted output of NAND element NA 422. Clocked inverter CN 425 inverts and provides the delay clock from delay circuit 411 that corresponds to its own stage (second stage) in accordance with the output of NAND element NA 422. Thus, selection circuit 421 is of a configuration that provides a delay clock that has been inverted and provided from either of clocked inverters CN 424 or 425 according to predecoding signal PREDECF that is received from the outside. In addition, selection circuits 421 are connected together by way of inverters.

As shown in FIG. 3, the following explanation regards signal waveforms in each section (refer to the block diagram of FIG. 1) of the DLL circuit in which the clock delay circuit of the prior art shown in FIG. 2 has been provided. In the following description, each of inverters NV 412 in delay circuits 411 of $(m-1)^{th}$ stage, $m^{th}$ stage, and $(m+1)^{th}$ stage of FIG. 2 are referred to as inverters NV #0, NV#1, and NV#2, respectively. In addition, each of clocked inverters CN 425 in selection circuit 421 of $(m-1)^{th}$ stage, $m^{th}$ stage, and $(m+1)^{th}$ stage of FIG. 2 are referred to as clocked inverter CN #0, CN#1, and CN#2, respectively; and NAND elements NA 422 of $(m-1)^{th}$ stage, $m^{th}$ stage, and $(m+1)^{th}$ stage of FIG. 2 are referred to as NAND elements NA#0, NA#1, and NA#2, respectively.

In FIG. 3, predecoding signal PREDECF<m−1> is "HIGH" in the interval up to time t1, and the other predecoding signals are all "LOW." In other words, select signal SELFB<m−1> that is provided from $(m-1)^{th}$ NAND element NA#0 and select signal SELFB<m> that is provided from $m^{th}$ NAND element NA#1 are "LOW," and the other select signals are all "HIGH." As a result, $(m-1)^{th}$ clocked inverter CN#0 and $m^{th}$ clocked inverter CN#1 are selected. In this case, the output of $(m-1)^{th}$ inverter NV#0 is provided as delay clock OUTF_O, and the output of $m^{th}$ inverter NV#1 is provided as delay clock OUTF_E. Delay clocks OUTR_O and OUTR_E are also provided from Rise CLK selection circuit section 42R by the same operations. Delay clocks OUTR_O and OUTR_E are mixed by interpolator circuit 103R at a mix ratio that corresponds to bias voltage BIASRE/O. In this way, data output clock QCLK_T is generated for providing data signal DQ in synchronization with the rising edge. Delay clocks OUTF_O and OUTF_E are also mixed by interpolator circuit 103F at a mix ratio that corresponds to bias voltage BIASFE/O. In this way, data output clock QCLK_B is generated for providing data signal DQ in synchronization with the falling edge.

Subsequently, when the mix ratio for interpolator circuits 103R and 103F is OUTF_E: OUTF_O=100%:0%, predecoding signal PREDECF<m> at time t1 is "HIGH," and the other predecoding signals are all "LOW." In other words, select signal SELFB<m> that is provided from $m^{th}$ NAND element NA#1 and select signal SELFB<m+1> that is provided from $(m+1)^{th}$ NAND element NA#2 are both "LOW," and the other select signals are all "HIGH." As a result, $m^{th}$ clocked inverter CN#1 and $(m+1)^{th}$ clocked inverter CN#2 are selected, and $(m-1)^{th}$ clocked inverter CN#0 is not selected. At this time, when the rising edge of the delay clock at node A that corresponds to the output portion of $(m-1)^{th}$ inverter NV#0 coincides with the timing of the occurrence of the noise that accompanies switching of select signal SELFB<m-1>, jitter is produced at node A. This jitter is then propagated to node B that corresponds to the output portion of $m^{th}$ inverter NV#1, delay clock OUTF_E, and data output clock QCLK_B.

Similarly, when the mix ratio for interpolator circuits 103R and 103F is OUTF_E: OUTF_O=100%: 0%, select signal SELFB<m-1> that is provided from $(m-1)^{th}$ NAND element NA#0 and select signal SELFB<m> that is provided from $m^{th}$ NAND element NA#1 are again "LOW" at time t2, and the other select signals are all "HIGH." As a result, $(m-1)^{th}$ clocked inverter CN#0 and $m^{th}$ clocked inverter CN#1 are selected, and $(m+1)^{th}$ clocked inverter CN#2 is not selected. At this time, when the rising edge of delay clock at node A coincides with the timing of the occurrence of noise that accompanies switching of select signal SELFB<m-1>, jitter is produced at node A. This jitter is then propagated to node B, delay clock OUTF_E, and data output clock QCLK_B.

Focusing on the delay clock at node A, noise occurs and the load fluctuates according to whether clocked inverter CN#1 of $(m-1)^{th}$ selection circuit 421 is in a selected state or nonselected state, whereby the amount of delay of $(m-1)^{th}$ delay circuit 411 varies, and this serves as a cause of jitter.

As described in the foregoing explanation, there exists a problem with a clock delay circuit of the prior art that jitter occurs when switching a delay clock signal that is selected in a selection circuit section, and this jitter is propagated through the delay circuit section.

SUMMARY OF THE INVENTION

It is an object of the present invention to provide a clock delay circuit that can prevent jitter, that is produced when switching the delay clock signal is selected in the selection circuit section, from being propagated through the delay circuit section.

To achieve the above-described object, the clock delay circuit according to the present invention includes: a delay circuit section for providing a plurality of delay clock signals that are produced with each delay clock signal having a different delay amount; a selection circuit section for arbitrarily selecting and providing a plurality of delay clock signals that are provided from the delay circuit section; and a jitter suppression element that is connected in series between the delay circuit section and the selection circuit section. The jitter suppression element may be an inverter, or may be a NAND element.

Due to the jitter suppression element connected in series between a delay circuit section and a selection circuit section, this configuration prevents jitter, that is produced when switching delay clock signals selected in the selection circuit section, from being propagated through the delay circuit section.

The above and other objects, features, and advantages of the present invention will become apparent from the following description with reference to the accompanying drawings, which illustrate examples of the present invention.

BRIEF DESCRIPTION OF THE DRAWINGS

FIG. 5 shows an example of the signal waveform in each section in a DLL circuit that is used in the clock delay circuit that is shown in FIG. 4.

DETAILED DESCRIPTION OF THE PREFERRED EMBODIMENTS

Figure 4:
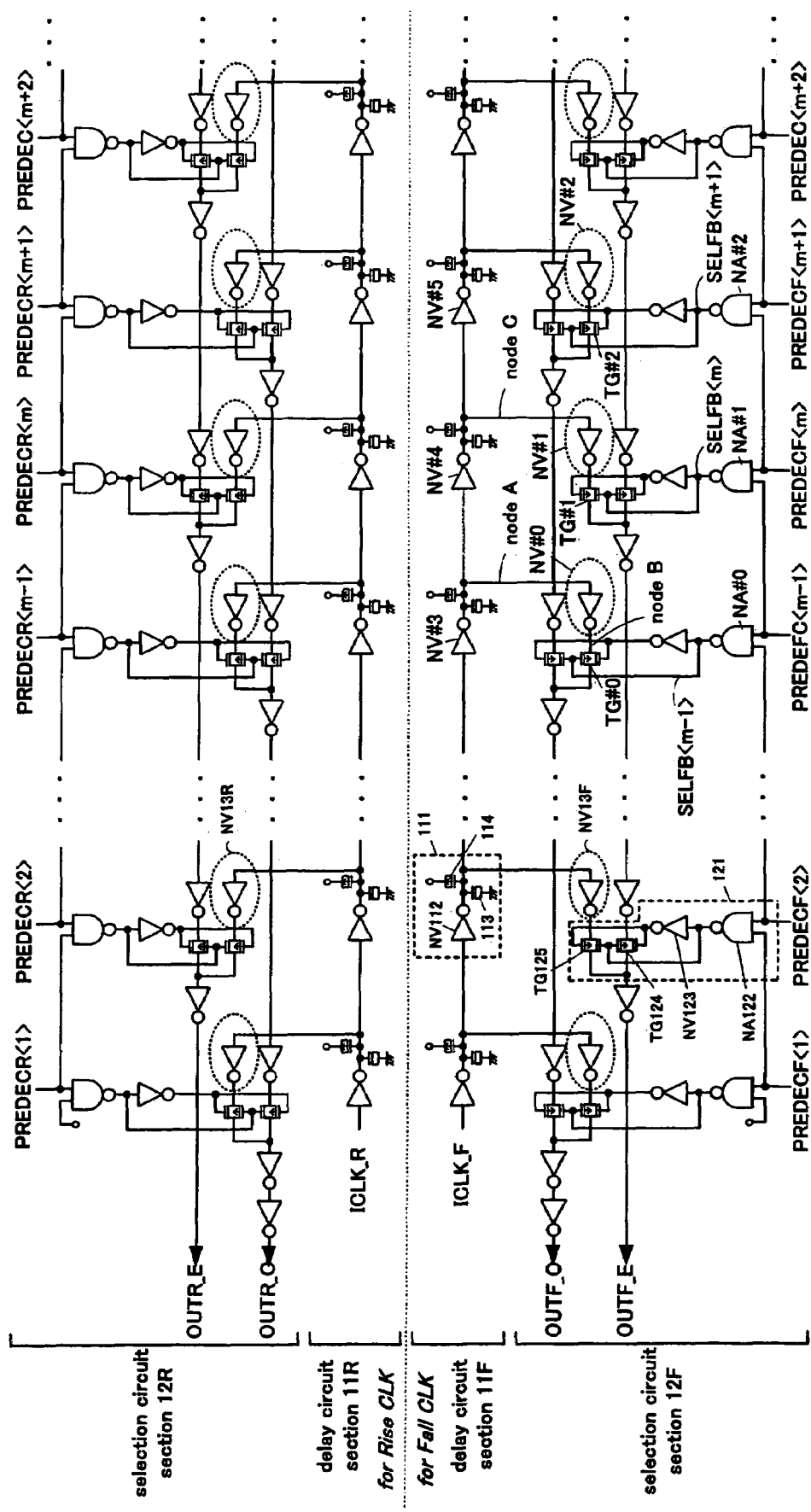
FIG. 4 shows the configuration of a clock delay circuit of the present embodiment.

FIG. 4 shows the configuration of a clock delay circuit of an embodiment of the present invention. The clock delay circuit of the present embodiment is intended to be provided as clock delay circuits 102R and 102F in the DLL circuit that is shown in FIG. 1.

As shown in FIG. 4, the clock delay circuit of the present embodiment includes: delay circuit section 11R, selection circuit section 12R, jitter suppression elements NV 13R, delay circuit section 11F, selection circuit section 12F, and jitter suppression elements NV 13F.

Figure 1:
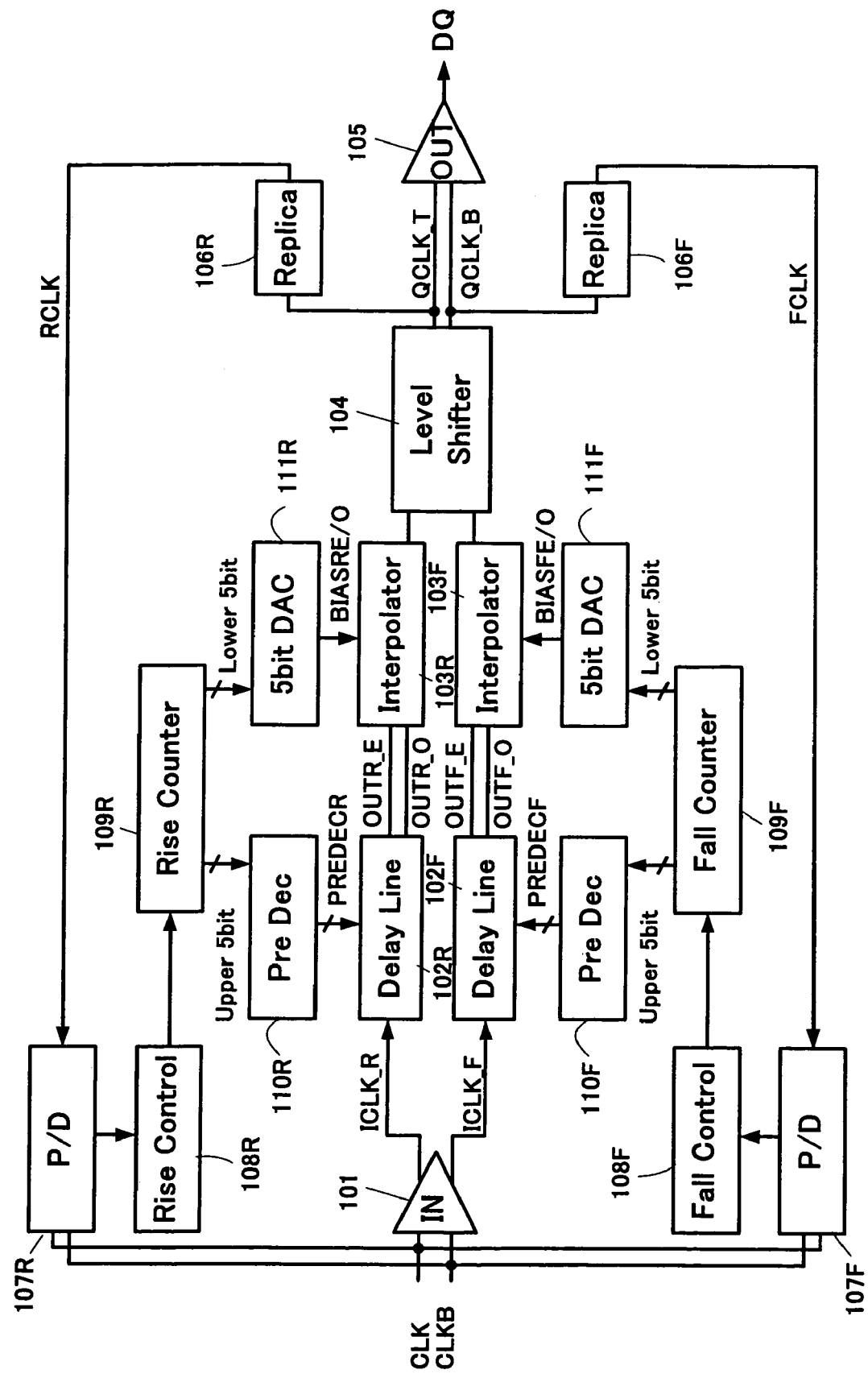
FIG. 1 is a block diagram showing an example of the configuration of a typical DLL circuit.
Figure 2:
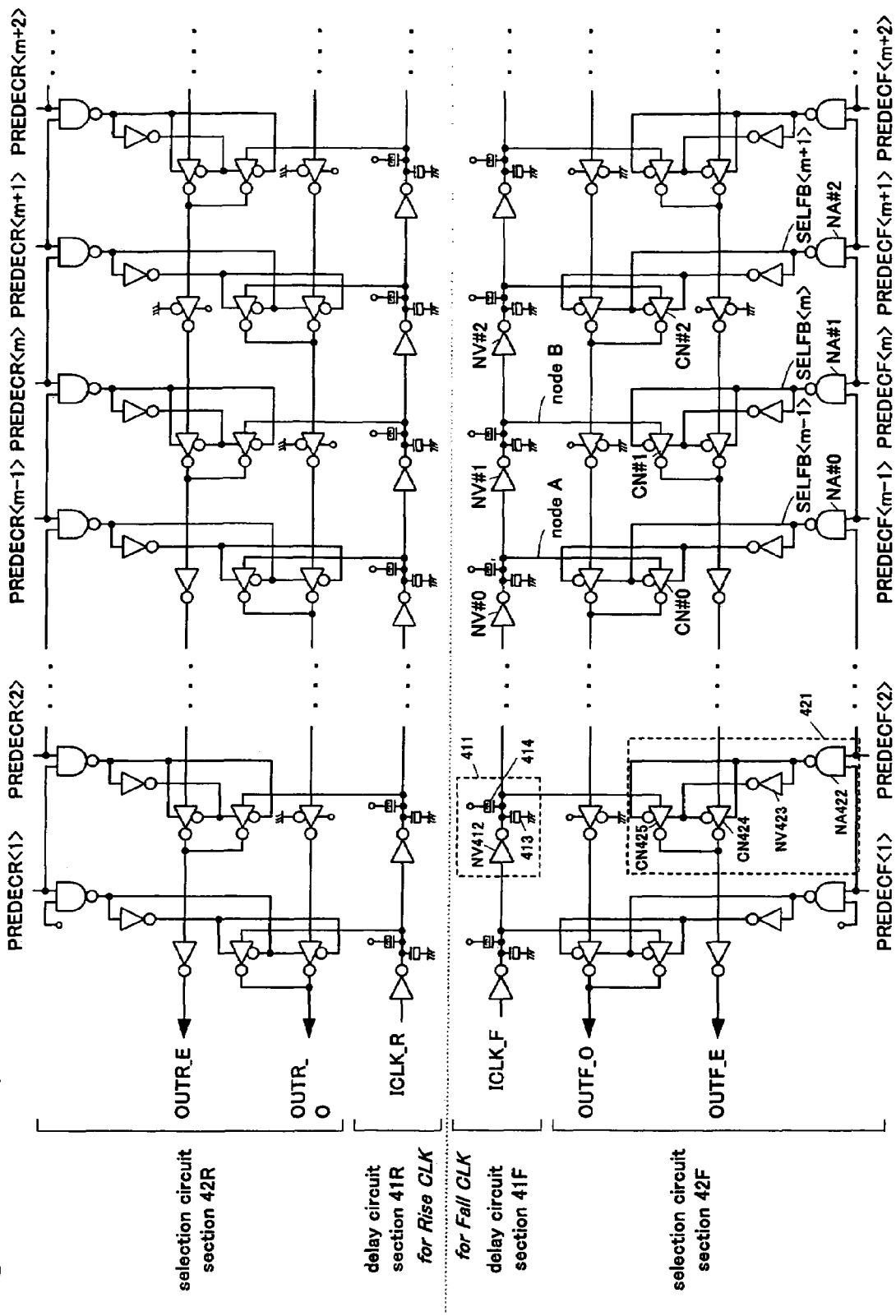
FIG. 2 shows an example of the configuration of a clock delay circuit of the prior art.
Figure 3:
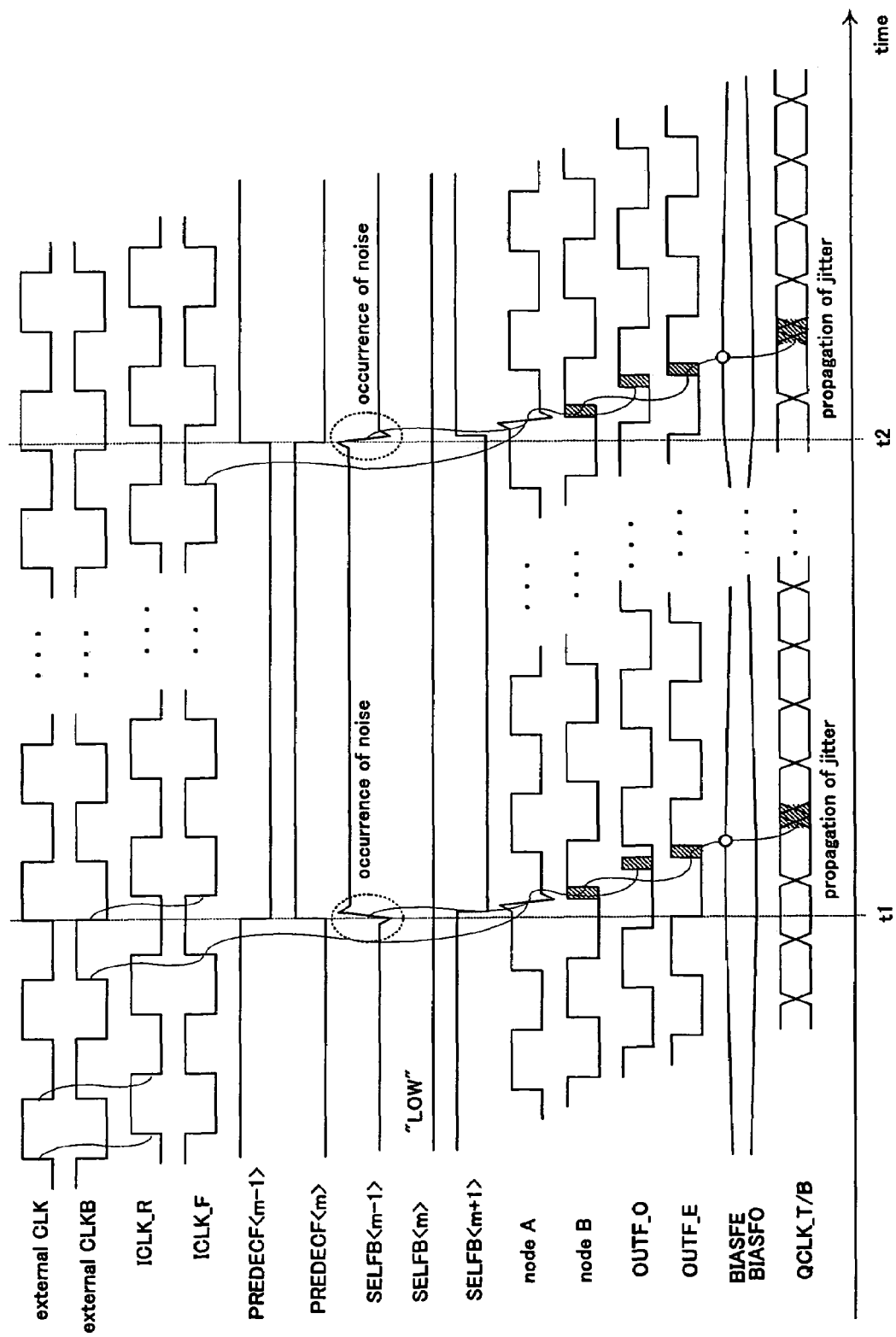
FIG. 3 shows an example of the signal waveform in each section in a DLL circuit that is used in the clock delay circuit that is shown in FIG. 2.

Delay circuit section 11R, selection circuit section 12R, and jitter suppression elements NV 13R constitute Rise CLK clock delay circuit 102R shown in FIG. 1. Delay circuit section 11R provides a plurality of delay clocks produced by delaying internal clock ICLK_R with each delay clock having a different delay amount. Selection circuit section 12R arbitrarily selects any one of a plurality of delay clocks that are provided from delay circuit section 11R and provides the selected delay clocks delay clocks OUTR_O and OUTR_E. Jitter suppression elements NV 13R are serially connected between delay circuit section 11R and selection circuit section 12R.

Delay circuit section 11F, selection circuit section 12F, and jitter suppression elements NV 13F constitute Fall CLK clock delay circuit 102F shown in FIG. 1. Delay circuit section 11F provides a plurality of delay clocks that are produced by delaying internal clock ICLK_F with each delay clock having a different delay amount. Selection circuit section 12F arbitrarily selects any one of the plurality of delay clocks that are provided from delay circuit section 11F and provides the selected delay clocks as delay clocks OUTF_O and OUTF_E. Jitter suppression elements NV 13F are serially connected between delay circuit section 11F and selection circuit section 12F.

Since the Rise CLK circuit and the Fall CLK circuit are of the same configuration, only the Fall CLK circuit configuration will be explained below.

Delay circuit section 11F is of a configuration in which a plurality of delay circuits 111 that delay internal clock ICLK_F by a fixed delay amount are connected in cascades, whereby the delay amounts of the delay clocks that are provided from each of the plurality of delay circuits 111 differ from each other.

Each of delay circuits 111 is made from: inverter NV 112, capacitor (constituted by an NMOS transistor in FIG. 4) 113, and capacitor (constituted by a PMOS transistor in FIG. 4) 114. In this way, delay circuit 111 adjusts the fixed delay amount by providing a capacitance load by means of capacitors 113 and 114 in the output portion of inverter NV 112.

Selection circuit section 12F is of a configuration in which a plurality of selection circuits 121 are connected in cascades, each of these selection circuits 121 being associated with the plurality of delay circuits 111, for selecting delay clocks that are provided from delay circuits 111 with which they are associated, and for providing the selected delay clocks as delay clocks OUTF_O and OUTF_E. In selection circuit section 12F, moreover, a delay clock that is selected by any selection circuit 121 that are of odd-numbered stage is provided as delay clock OUTF_O, and a delay clock selected by any selection circuit 121 that are of even-numbered stage is provided as delay clock OUTF_E.

Each of selection circuits 121 is made up from: NAND element NA 122, inverter NV 123, and transfer gates (transfer switches) TG 124 and TG 125.

For example, an operation as described below is carried out in second-stage selection circuit 121, which is an even-numbered stage, among selection circuits 121 that make up selection circuit section 12F of FIG. 4. NAND element NA 122 calculates the NAND of both predecoding signal PREDECF <2> from predecoder circuit 110F to selection circuit 121 of its own stage (second stage) and predecoding signal PREDECF<1> from predecoder circuit 110F to selection circuit 121 of the preceding stage (first stage). Inverter NV 123 inverts and provides the output of NAND element NA 122. Transfer gate TG 124 either conducts or cuts off the delay clock from selection circuit 121 of the next even-numbered stage (the fourth stage) according to the output of NAND element NA 122. Transfer gate TG 125 either conducts or cuts off the delay clock from delay circuit 111 that corresponds to its own stage (the second stage) in accordance with the inverted output of NAND element NA 122. Selection circuits 121 are thus configurations for providing delay clocks that are conducted by either of transfer gates TG 124 or TG 125 in accordance with predecoding signal PREDECF that is applied from the outside. Selection circuits 121 are further connected together by way of inverters.

A plurality of jitter suppression elements NV 13F are provided that are associated with the plurality of delay circuits 111 and selection circuits 121, each of jitter suppression elements NV 13F being an element that is connected in series between delay circuit 111 and selection circuit 121 with which it is associated. In FIG. 4, jitter suppression elements NV 13F is an inverter, but the present invention is not limited to this form, and jitter suppression elements 13F may also be NAND elements.

As shown in FIG. 5, the following explanation regards the signal waveform in each part of the DLL circuit (see the block diagram of FIG. 1) in which the clock delay circuit of the present embodiment shown in FIG. 4 has been provided. In the following description, jitter suppression elements NV 13F of $(m-1)^{th}$ stage, $m^{th}$ stage, and $(m+1)^{th}$ stage of FIG. 4 are referred to as jitter suppression elements NV#0, NV#1, and NV#2, respectively. In addition, inverters NV 112 in delay circuits 111 of $(m-1)^{th}$ stage, $m^{th}$ stage, and $(m+1)^{th}$ stage of FIG. 4 are referred to as inverters NV#3, NV#4, and NV#5, respectively. Transfer gates TG 125 in selection circuits 121 of $(m-1)^{th}$ stage, $m^{th}$ stage, and $(m+1)^{th}$ stage of FIG. 4 are referred to as transfer gates TG#0, TG#1, and TG#2, respectively; and NAND elements NA 122 of $(m-1)^{th}$ stage, $m^{th}$ stage, and $(m+1)^{th}$ stage of FIG. 4 are referred to as NAND elements NA#0, NA#1, and NA#2, respectively.

In FIG. 5, in the interval up to time t1, predecoding signal PREDECF<m-1> is "HIGH" and the other predecoding signals are all "LOW." In other words, select signal SELFB<m-1> that is provided from NAND element NA#0 of $(m-1)^{th}$ stage and select signal SELFB<m> that is provided from NAND element NA#1 of $m^{th}$ stage are "LOW," and the other select signals are all "HIGH." As a result, transfer gate TG#0 of $(m-1)^{th}$ stage and transfer gate TG#1 of $m^{th}$ stage are selected. In this case, the output of inverter NV#3 of $(m-1)^{th}$ stage is provided as delay clock OUTF_O, and the output of inverter NV#4 of $m^{th}$ stage is provided as delay clock OUTF_E. Delay clocks OUTR_O and OUTR_E are provided by the same operations from Rise CLK selection circuit section 12R. Delay clocks OUTR_O and OUTR_E are mixed by interpolator circuit 103R at a mix ratio that corresponds to bias voltage BIASRE/O, whereby data output clock QCLK_T is generated for providing data signal DQ in synchronization with the rising edge. In addition, delay clocks OUTF_O and OUTF_E are mixed by interpolator circuit 103F at a mix ratio that corresponds to bias voltage BIASFE/O, whereby data output clock QCLK_B is generated for providing data signal DQ in synchronization with the falling edge.

Subsequently, when the mix ratio for interpolator circuits 103R and 103F is OUTF_E: OUTF_O=100%: 0%, predecoding signal PREDECF<m> at time t1 is "HIGH," and the other predecoding signals are all "LOW." In other words, select signal SELFB<m> that is provided from NAND element NA#1 of $m^{th}$ stage and select signal SELFB<m+1> that is provided from NAND element NA#2 of $(m+1)^{th}$ stage are "LOW" and the other select signals are all "HIGH." As a result, transfer gate TG#1 of $m^{th}$ stage and transfer gate TG#2 of $(m+1)^{th}$ stage are selected, and transfer gate TG#0 of $(m-1)^{th}$ stage is not selected. At this time, when the rising edge of delay clock in node B that corresponds to the input portion of transfer gate TG#0 of $(m-1)^{th}$ stage coincides with the timing of the occurrence of noise that accompanies switching of select signal SELFB<m-1>, jitter occurs at node B. However, the presence of jitter suppression element NV#0 prevents the jitter that occurs at node B from being propagated to node A that corresponds to the output portion of inverter NV#3 of $(m-1)^{th}$ stage. As a result, jitter that occurs at node B is not propagated to node C that corresponds to the output portion of inverter NV#4 of $m^{th}$ stage, nor propagated to delay clock OUTF_E, or to data output clock QCLK_B.

When the mix ratio for interpolator circuits 103R and 103F subsequently becomes OUTF_E: OUTF_O=100%: 0%, select signal SELFB<m-1> that is provided from NAND element NA#0 of $(m-1)^{th}$ stage and select signal SELFB<m> that is provided from NAND element NA#1 of $m^{th}$ stage again become "LOW" at time t2, and the other select signals all become "HIGH." As a result, transfer gate TG#0 of $(m-1)^{th}$ stage and transfer gate TG#1 of $m^{th}$ stage are selected, and transfer gate TG#2 of $(m+1)^{th}$ stage is not selected. At this time, when the rising edge of the delay clock at node B coincides with the timing of the occurrence of noise that accompanies switching of select signal SELFB<m-1>, jitter occurs at node B. However, the presence of jitter suppression element NV#0 prevents the jitter that occurs at node B from being propagated to node A. As a result, jitter that occurs at node B is not propagated to node C, delay clock OUTF_E, or data output clock QCLK_B.

Focusing on the delay clocks at node A, noise does not occur at node A and the load is uniform regardless of whether transfer gate TG#1 of selection circuit 121 of $(m-1)^{th}$ stage is in the selected or nonselected state. The delay amount for delay circuit 111 is thus kept uniform regardless of which transfer gate of selection circuit 121 is selected, and this uniformity can further contribute to the reduction of jitter of data output clocks QCLK_T and QCLK_B.

While preferred embodiments of the present invention have been described using specific terms, such description is for illustrative purposes only, and it is to be understood that changes and variations may be made without departing from the spirit or scope of the following claims.

What is claimed is:

1. A clock delay circuit comprising:
   a delay circuit section for delaying a clock signal with a different delay amount to provide a plurality of delay clock signals;
   a selection circuit section for selecting and providing any one of the plurality of delay clock signals that are provided from said delay circuit section; and
   jitter suppression elements that are connected in series between said delay circuit section and said selection circuit section;
   wherein:
   said delay circuit section is of a configuration wherein a plurality of delay circuits are connected in a cascade configuration for delaying clocks each having a fixed delay amount;
   said selection circuit section is of a configuration wherein a plurality of selection circuits are connected in a cascade configuration, each of said selection circuits being associated with a respective delay circuit of said plurality of delay circuits and being configured to select and provide delay clock signal that has been provided from the delay circuit associated with said selection circuit; and
   said jitter suppression elements are associated with each of said plurality of delay circuits and each of said plurality of selection circuits, each of said jitter suppression elements being connected in series between the delay circuit and the selection circuit associated with said jitter suppression elements.

2. The clock delay circuit according to claim 1, wherein each of said selection circuits comprises:
   a first transfer switch for conducting or cutting off one of a plurality of delay clock signal from the delay circuit associated with one of a plurality of said selection circuit;
   a second transfer switch for conducting or cutting off one of a plurality of delay clock signal that has been selected by another one of a plurality of selection circuit; and
   a NAND element for providing a signal for causing one of said first and second transfer switch to conduct the delay clock signal and causing the other to cut off the delay clock signal, depending on a second signal that is received from the outside;
   wherein said jitter suppression elements are connected in series between said first transfer switch and said delay circuit of said selection circuit.

3. The clock delay circuit according to claim 1, wherein each of said jitter suppression elements comprises an inverter.

4. The clock delay circuit according to claim 1, wherein each of said jitter suppression elements comprises a NAND elements.

5. The clock delay circuit according to claim 1, wherein said clock delay circuit is a one in a DLL circuit mounted in a semiconductor memory device.

* * * * *